(12) United States Patent
Naganawa et al.

(10) Patent No.: US 9,698,370 B2
(45) Date of Patent: Jul. 4, 2017

(54) GAS BARRIER FILM AND GAS BARRIER FILM PRODUCTION METHOD

(71) Applicant: LINTEC Corporation, Tokyo (JP)

(72) Inventors: Satoshi Naganawa, Tokyo (JP); Yuta Suzuki, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/367,252

(22) PCT Filed: Nov. 27, 2012

(86) PCT No.: PCT/JP2012/080531
§ 371 (c)(1),
(2) Date: Jun. 20, 2014

(87) PCT Pub. No.: WO2013/108487
PCT Pub. Date: Jul. 25, 2013

(65) Prior Publication Data
US 2015/0287954 A1  Oct. 8, 2015

(30) Foreign Application Priority Data
Jan. 20, 2012 (JP) .................. 2012-010110

(51) Int. Cl.
*H01L 51/52* (2006.01)
*C23C 14/48* (2006.01)
*C08J 7/04* (2006.01)

(52) U.S. Cl.
CPC .......... *H01L 51/5253* (2013.01); *C08J 7/047* (2013.01); *C23C 14/48* (2013.01); *C08J 2367/02* (2013.01);
(Continued)

(58) Field of Classification Search
CPC .... C08J 2367/02; C08J 2483/16; C08J 7/047; C08J 7/18; C23C 14/48
See application file for complete search history.

(56) References Cited

U.S. PATENT DOCUMENTS 6,617,052 B2  9/2003  Morii
6,692,326 B2  2/2004  Choi et al.
(Continued)

FOREIGN PATENT DOCUMENTS

CN   1575050 A   2/2005
EP   1484805 A2  12/2004
(Continued)

OTHER PUBLICATIONS

Supplementary European Search Report mailed Aug. 20, 2015, for European Application No. 12866013.1; 9 pages.
(Continued)

*Primary Examiner* — Dah-Wei D Yuan
*Assistant Examiner* — Kristen A Dagenais
(74) *Attorney, Agent, or Firm* — Fitch, Even, Tabin & Flannery LLP

(57) ABSTRACT

The present invention is aiming to provide a gas barrier film having excellent gas barrier properties and also having superior transparency and the like, and an efficient method for producing such a gas barrier film.
The present invention provides a gas barrier film having a gas barrier layer on a base material, and a method for producing such a gas barrier film, in which the gas barrier layer includes, from the surface side toward the base material side, a first region and a second region having different refractive indices, the value of the refractive index in the first region is adjusted to a value within the range of 1.50 to 1.68, and the value of the refractive index in the second region is adjusted to a value within the range of 1.40 to below 1.50.

6 Claims, 14 Drawing Sheets

(52) U.S. Cl.
CPC .... *C08J 2483/16* (2013.01); *Y10T 428/24942* (2015.01)

(56) References Cited

U.S. PATENT DOCUMENTS

| | | | |
|---|---|---|---|
| 8,771,834 | B2 | 7/2014 | Uemura et al. |
| 8,846,200 | B2 | 9/2014 | Ito et al. |
| 8,906,492 | B2 | 12/2014 | Suzuki et al. |
| 2002/0113241 | A1 | 8/2002 | Kubota et al. |
| 2003/0003225 | A1 | 1/2003 | Choi et al. |
| 2003/0129451 | A1 | 7/2003 | Nukada et al. |
| 2004/0081912 | A1* | 4/2004 | Nagahara ............... G03F 7/039 430/270.1 |
| 2004/0247938 | A1 | 12/2004 | Yamaguchi et al. |
| 2005/0100653 | A1* | 5/2005 | Chang ................... A01H 5/10 426/635 |
| 2005/0100853 | A1* | 5/2005 | Tadros ................. A61C 19/063 433/6 |
| 2005/0263827 | A1* | 12/2005 | Shiba ............... H01L 21/76229 257/374 |
| 2007/0120108 | A1 | 5/2007 | Asabe |
| 2008/0023442 | A1 | 1/2008 | Ito et al. |
| 2008/0199977 | A1 | 8/2008 | Weigel et al. |
| 2008/0319121 | A1 | 12/2008 | Mitani et al. |
| 2010/0019654 | A1 | 1/2010 | Hayashi |
| 2011/0041913 | A1 | 2/2011 | Luecke et al. |
| 2011/0121270 | A1 | 5/2011 | Kim et al. |
| 2012/0064321 | A1* | 3/2012 | Suzuki ................... C08J 7/123 428/219 |
| 2012/0107607 | A1 | 5/2012 | Takaki et al. |
| 2012/0241889 | A1 | 9/2012 | Takemura et al. |
| 2012/0295120 | A1 | 11/2012 | Nagamoto et al. |
| 2013/0047889 | A1 | 2/2013 | Iwaya et al. |
| 2013/0068136 | A1 | 3/2013 | Iwaya et al. |
| 2013/0202900 | A1 | 8/2013 | Uemura et al. |
| 2013/0224503 | A1 | 8/2013 | Suzuki et al. |
| 2013/0244044 | A1 | 9/2013 | Ito et al. |
| 2014/0342149 | A1 | 11/2014 | Naganawa et al. |
| 2014/0374665 | A1 | 12/2014 | Iwaya et al. |
| 2015/0287954 | A1 | 10/2015 | Naganawa et al. |
| 2015/0367602 | A1 | 12/2015 | Iwaya et al. |

FOREIGN PATENT DOCUMENTS

| | | | |
|---|---|---|---|
| EP | 2410005 | A1 | 1/2012 |
| JP | 2001-171047 | A | 6/2001 |
| JP | 2002-231443 | A | 8/2002 |
| JP | 2007-59131 | A | 3/2007 |
| JP | 2007-180014 | A | 7/2007 |
| JP | 2007-237588 | A | 9/2007 |
| JP | 2008-71608 | A | 3/2008 |
| JP | 2009-196155 | A | 9/2009 |
| JP | 2009-252574 | A | 10/2009 |
| JP | 2010-27561 | A | 2/2010 |
| JP | 2010-158832 | A | 7/2010 |
| JP | WO 2010107018 | A1 * | 9/2010 .............. C08J 7/123 |
| JP | 2010-232569 | A | 10/2010 |
| JP | 2011-26645 | A | 2/2011 |
| JP | 2011-36779 | A | 2/2011 |
| JP | 2011-68042 | A | 4/2011 |
| JP | 2011-68124 | A | 4/2011 |
| JP | 2011-213847 | A | 10/2011 |
| JP | 2011-213907 | A | 10/2011 |
| WO | 2010/107018 | A1 | 9/2010 |
| WO | 2011007543 | A1 | 1/2011 |
| WO | 2011043315 | A1 | 4/2011 |
| WO | 2011/074440 | A1 | 6/2011 |
| WO | 2013035432 | A1 | 3/2013 |
| WO | 2013108487 | A1 | 7/2013 |
| WO | 2013125352 | A1 | 8/2013 |

OTHER PUBLICATIONS

Office Action mailed Nov. 4, 2015, for U.S. Appl. No. 14/126,129.
Webster's Ninth New Collegiate Dictionary; Merriam-Webster Inc; Springfield, Massachusetts, USA; 1990; p. 671.
Hawley's Condensed Chemical Dictionary; 12th edition; Van Nostrand Reinhold Company; New York; 1993; p. 680.
Optical constants of SiO2 (Silicon dioxide, Silica, Quartz); http://refractiveindex.info/?shelf=main&book=SiO2&page=Malitson; viewed Aug. 24, 2016.
Office Action mailed Apr. 20, 2016, for U.S. Appl. No. 14/126,129.
ISO 11664-4:2008 (CIE S 014-4/E:2007) Colorimetry—Part 4:CIE 1976 L*a*b* Colour Space.
Supplementary European Search Report mailed Sep. 23, 2015, for European Application No. 13752126.6.
Office Action mailed Jun. 1, 2016, for U.S. Appl. No. 14/378,687.
European Office Action mailed Feb. 22, 2017, for European Application No. 12866013.1.

* cited by examiner

GAS BARRIER FILM AND GAS BARRIER FILM PRODUCTION METHOD

TECHNICAL FIELD

The present invention relates to a gas barrier film and a method for producing a gas barrier film. More particularly, the invention relates to a gas barrier film which has excellent gas barrier properties and also has superior transparency, with suppressed coloration, and to a method for producing such a gas barrier film.

BACKGROUND ART

There have been hitherto proposed methods for producing a gas barrier film characterized by having excellent gas barrier properties and also requiring a short production time (see, for example, Patent Document 1), together with substitutes for glass substrates for organic EL elements.

More specifically, the method for producing a gas barrier film described in Patent Document 1 is a method for producing a gas barrier film, characterized in that a perhydropolysilazane-containing liquid is applied on at least one surface of a base material, a polysilazane film formed by heating and drying the liquid is subjected to a normal pressure plasma treatment or a vacuum plasma treatment, and thereby a gas barrier film having a water vapor transmission rate (WVTR), which is an index for water vapor barrier properties, of 1 g/(m$^2$·day) or less and having a thickness of 0.01 µm to 5 µm is obtained.

Furthermore, there has been proposed a method for producing a gas barrier film including a silicon oxide thin film having very high gas barrier properties so that the gas barrier film can be applied to a resin base material for organic photoelectric conversion elements (see, for example, Patent Document 2).

More specifically, the method for producing a gas barrier film described in Patent Document 2 is a method for producing a gas barrier film, characterized in that a silicon-containing liquid is applied on at least one surface of a base material and dried at 20° C. to 120° C. to form a silicon thin film, and then a silicon oxide thin film is formed on the silicon thin film by a plasma CVD method using an organosilicon compound and a reactive gas containing oxygen.

Furthermore, a gas barrier film including a carbon-containing silicon oxide film, which exhibits excellent transparency without having decreased gas barrier properties, has been proposed (see, for example, Patent Document 3).

More specifically, the gas barrier film described in Patent Document 3 is a gas barrier film characterized in that a carbon-containing silicon oxide film having a film thickness of 5 nm to 300 nm is formed on at least one surface of a base material film, and the composition ratio (C/Si) of carbon atoms (C) and silicon atoms (Si) in the carbon-containing silicon oxide film is within the range of above 0 and equal to 1 or less, while the degree of coloration (YI) is within the range of 1.0 to 5.0.

Furthermore, in order to be able to provide a gas barrier film having excellent transmittance and color tinge, there have been proposed a gas barrier film having regions A, B and C, in which the silicon content, the oxygen content, and the nitrogen content are different, and a method for production thereof (see, for example, Patent Document 4).

More specifically, the gas barrier film described in Patent Document 4 is a gas barrier film which is configured to include a region A in which the oxygen content is larger than the nitrogen content; a region B in which the nitrogen content is larger than the oxygen content, and to include, between these region A and region B, a region C in which the oxygen content of the region A gradually decreases, while the nitrogen content gradually increases toward the region B. This gas barrier film is a gas barrier film having the various regions disposed on a base material film in the order of regions ACB, regions BCA, or regions ACBCA, toward the surface.

CITATION LIST

Patent Document

Patent Document 1: Japanese Patent Application Laid-Open (JP-A) No. 2007-237588
Patent Document 2: JP-A No. 2011-26645
Patent Document 3: JP-A No. 2010-158832
Patent Document 4: JP-A No. 2009-196155

DISCLOSURE OF INVENTION

Problem to be Solved by the Invention

However, although the method for producing a gas barrier film disclosed in Patent Document 1 involves subjecting a polysilazane film to a normal pressure plasma treatment or a vacuum plasma treatment, since no consideration is given for the barrier layer after the plasma treatment, there has been a problem that the gas barrier film still has poor gas barrier properties, or fluctuations are observed in the gas barrier properties.

Furthermore, the method for producing a gas barrier film disclosed in Patent Document 2 needs to form, on a predetermined silicon thin film (polysilazane film or the like), another kind of a silicon oxide thin film by a plasma CVD method.

Therefore, there has been a problem that thickness reduction of the gas barrier film or continuous film formation is difficult to achieve, or the adhesiveness between the silicon thin film as a foundation and the silicon oxide thin film formed by a plasma CVD method is insufficient.

Furthermore, the method for producing a gas barrier film disclosed in Patent Document 3 has a problem that the gas barrier film obtainable thereby still have low gas barrier properties, fluctuations are observed in the gas barrier properties, or the gas barrier film has insufficient durability or the like.

Also, the gas barrier film and the method for production thereof disclosed in Patent Document 4 have a problem that since the gas barrier film includes a region B in which the amount of nitrogen is larger than the amount of oxygen as a portion of the multilayer structure, the gas barrier film thus obtainable may undergo coloration (yellowing) or have decreased transparency, or the gas barrier properties are still insufficient.

Moreover, since the various regions A to C are formed by repeating plural film-forming steps, there is also a problem that the production process is complicated, and productivity is poor.

Thus, the inventors of the present invention have conducted a thorough investigation, and as a result, the inventors found that in regard to a gas barrier film having a gas barrier layer on a base material, when the gas barrier layer has regions having different refractive indices, a gas barrier film which has excellent gas barrier properties and also has superior transparency, with suppressed coloration, is obtained. Thus, the inventors completed the present invention.

That is, an object of the present invention is to provide a gas barrier film having excellent gas barrier properties and also having superior transparency, with suppressed coloration (yellowing), and to provide a method for producing a gas barrier film, by which such a gas barrier film may be obtained efficiently.

Means for Solving Problem

According to the present invention, there is provided a gas barrier film having, on a base material, a gas barrier film formed by implanting ions into a polysilazane layer, in which when the surface of the gas barrier layer that is in contact with the base material is designated as the base material side, while the reverse surface is designated as the surface side, the gas barrier layer has a first region and a second region that are disposed from the surface side toward the base material side and have different refractive indices, the first region having a refractive index of a value within the range of 1.50 to 1.68, and the second region having a refractive index of a value within the range of 1.40 to below 1.50. Thus, the problems described above can be solved.

That is, when the gas barrier layer has a first region in which the refractive index is relatively high to a predetermined extent and a second region in which the refractive index is relatively low to a predetermined extent, the gas barrier film has excellent gas barrier properties, and also, superior transparency can be obtained.

Furthermore, on the occasion of constructing the gas barrier film of the present invention, it is preferable to adjust the film density in the first region to a value within the range of 2.3 g/cm$^3$ to 3.0 g/cm$^3$.

As such, when a gas barrier film having a predetermined gas barrier layer is constructed while the film density of the first region is considered, superior transparency or gas barrier properties can be obtained, and also, favorable flexibility that does not bring about generation of cracks even if the gas barrier film is bent considerably, can be obtained.

Furthermore, on the occasion of constructing the gas barrier film of the present invention, it is preferable to adjust the thickness of the first region to a value within the range of 10 nm to 30 nm.

As such, when a gas barrier film having a predetermined gas barrier layer is constructed while the thickness of the first region is considered, superior transparency or gas barrier properties can be obtained, and also, favorable flexibility that does not bring about generation of cracks even if the gas barrier film is bent considerably, can be obtained.

Furthermore, on the occasion of constructing the gas barrier film of the present invention, in the first region and the second region, or in any one of the regions, when the amount of oxygen measured by XPS is designated as X mol %, the amount of nitrogen is designated as Y mol %, and the amount of silicon is designated as Z mol %, it is preferable to adjust the ratio of X/Z to a value within the range of 1.0 to 2.5, and to adjust the ratio of Y/Z to a value within the range of 0 to 0.5.

As such, when the ratio of the amounts of elements (X/Z or Y/Z) in the gas barrier layer is considered, superior transparency or gas battier properties can be obtained.

Furthermore, on the occasion of constructing the gas barrier film of the present invention, when the amount of oxygen measured by XPS is designated as X mol %, and the amount of silicon is designated as Z mol %, it is preferable that the change curve of X/Z in the first region has a minimum point.

When the change curve of X/Z for the gas barrier layer has a minimum point as such, superior transparency or gas barrier properties can be obtained, and also, favorable flexibility that does not bring about generation of cracks even if the gas barrier film is bent considerably, can be obtained.

Furthermore, on the occasion of constructing the gas barrier film of the present invention, it is preferable to adjust the value of the total light transmittance (Tt) of the gas barrier film to 88% or more, and the value of the yellowness index (YI) to 4 or less.

When the total light transmittance (Tt) and yellowness degree (YI) of the gas barrier layer are limited to predetermined ranges as such, superior transparency or colorlessness can be obtained.

Furthermore, another embodiment of the present invention is a method for producing a gas barrier film having a gas barrier layer on a base material, the method including the following steps (1) to (3):

(1) a polysilazane layer forming step of forming a polysilazane layer on a base material;

(2) a seasoning step of performing seasoning of the polysilazane layer; and (3) an ion implantation step of implanting ions into the polysilazane layer, and forming a gas barrier layer having, from the surface side toward the base material side, a first region having a refractive index of a value within the range of 1.50 to 1.68, and a second region having a refractive index of a value within the range of 1.40 to below 1.50.

That is, a first region having a relatively higher refractive index and a second region having a relatively lower refractive index can be provided substantially in a single process, by implanting ions into a predetermined polysilazane layer applied on a base material as such.

Therefore, by producing a gas barrier film as such, a gas barrier film having a gas barrier layer having excellent gas barrier properties and also having superior transparency can be obtained efficiently and continuously.

Furthermore, on the occasion of carrying out the method for producing a gas barrier film of the present invention, it is preferable to adjust the value of the refractive index of the polysilazane layer after the seasoning step and before the ion implantation step, to the range of 1.48 to 1.63.

When the gas barrier film is produced as such, the refractive indices of the first region and the second region after the ion implantation step can be easily controlled respectively to predetermined ranges, and a gas barrier film having a gas barrier layer which has excellent gas barrier properties and also has superior transparency can be obtained efficiently.

BEST MODE(S) FOR CARRYING OUT THE INVENTION

First Exemplary Embodiment

A first exemplary embodiment is a gas barrier film having a gas barrier layer on a base material, in which when the surface of the gas barrier layer that is contact with the base material is designated as the base material side, and the reverse surface is designated as the surface side, the gas barrier layer has a first region and a second region that are disposed from the surface side toward the base material side and have different refractive indices, the first region having a refractive index of a value within the range of 1.50 to 1.68, and the second region having a refractive index of a value within the range of 1.40 to below 1.50.

Hereinafter, the gas barrier film of the first exemplary embodiment will be explained specifically with appropriate reference to the drawings.

1. Gas Barrier Layer
(1) Refractive Index

The gas barrier layer according to the first exemplary embodiment has a first region and a second region that have different refractive indices, and the refractive index in the first region is adjusted to a value within the range of 1.50 to 1.68, while the refractive index in the second region is adjusted to a value within the range of 1.40 to below 1.50.

The reason for this is that when the gas barrier layer is employed as the first region having a refractive index that is relatively high in a predetermined range, and the surface side that is brought into contact with the base material of the gas barrier layer (base material side) is employed as the second region having a refractive index that is relatively low in a predetermined range, excellent gas barrier properties are obtained, and also, superior transparency and the like can be obtained. That is, it is because a very high total light transmittance can be obtained by decreasing the reflectance at the surface side of the gas barrier layer of the gas barrier film.

Therefore, it is more preferable to adjust the refractive index in the first region to a value within the range of 1.50 to 1.66, and to adjust the refractive index in the second region to a value within the range of 1.42 to 1.49; and it is even more preferable to adjust the refractive index in the first region to a value within the range of 1.51 to 1.60, and to adjust the refractive index in the second region to a value within the range of 1.44 to 1.48.

Next, the relationships of the refractive index of the first region in the gas barrier layer according to the first exemplary embodiment, to the water vapor transmission rate (WVTR), Tt, YI, and b* will be respectively described with reference to FIG. 1 and FIG. 2.

Here, the WVTR is the water vapor transmission rate, and is an index for gas barrier properties. Tt is the total light transmittance, and is an index for transparency. YI and b* are the yellowness index and the chromaticness index according to the CIE1976 L*a*b* color system, respectively, and are each an index for the degree of colorability (yellowing).

Figure 1:
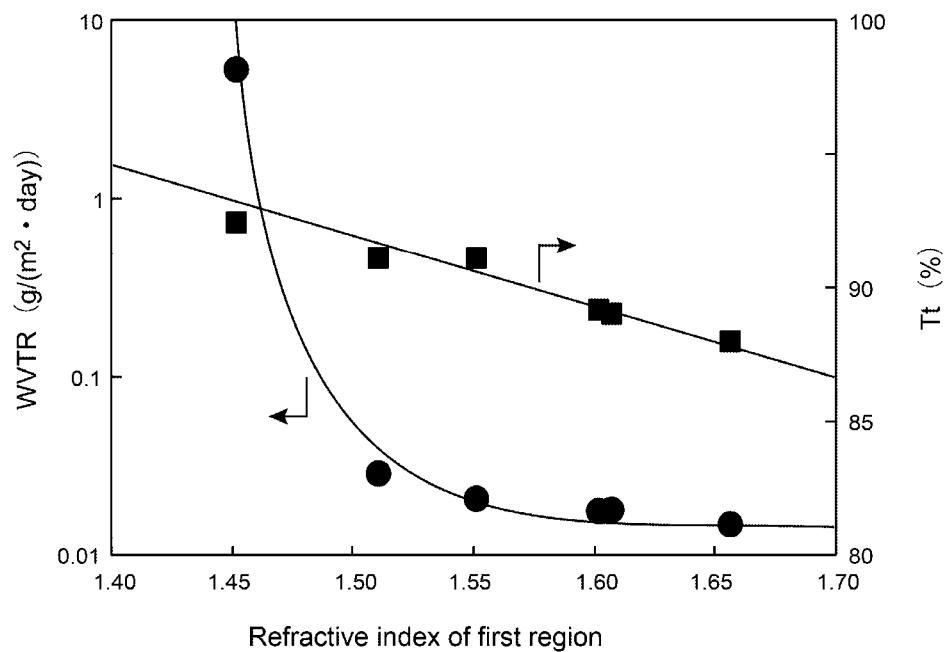
FIG. 1 is a diagram provided to illustrate the relationships of the refractive index of the first region in the gas barrier layers of Examples and Comparative Example, to WVTR and to Tt, respectively.

FIG. 1 is a diagram illustrating the relationship of the refractive index of the first region in the gas barrier layers of Examples and Comparative Example, to WVTR and to Tt, respectively. That is, in FIG. 1, the horizontal axis represents the values of the refractive index of the first region of the gas barrier layer in the gas barrier films of Examples and Comparative Example; the left vertical axis represents the values of WVTR (g/(m$^2$·day)) of the gas barrier film; the right vertical axis represents the values of Tt (%) of the gas barrier film.

As can be understood from such FIG. 1, as the value of the refractive index of the first region increases, the value of WVTR decreases logarithmically to a large extent, and a tendency that the gas barrier properties markedly increase can be seen.

Therefore, when the value of such refractive index in the first region is adjusted to a value within the range of 1.50 to 1.68, a significantly low value of WVTR of about 0.01 g/(m$^2$·day) to 0.05 g/(m$^2$·day) can be obtained.

On the other hand, as shown in FIG. 1, there was observed a tendency that as the value of the refractive index of the first region in the gas barrier layer increases, the value of Tt gradually decreases, and light transmissibility is slightly decreased.

Therefore, when the value of such refractive index in the first region is adjusted to a value within the range of 1.50 to 1.68, a very high value of Tt of about 88% to 92% can be obtained.

Therefore, a gas barrier layer having excellent gas barrier properties and having superior transparency can be obtained by adjusting the value of the refractive index in the first region to a value within the range of 1.50 to 1.68.

Figure 2:
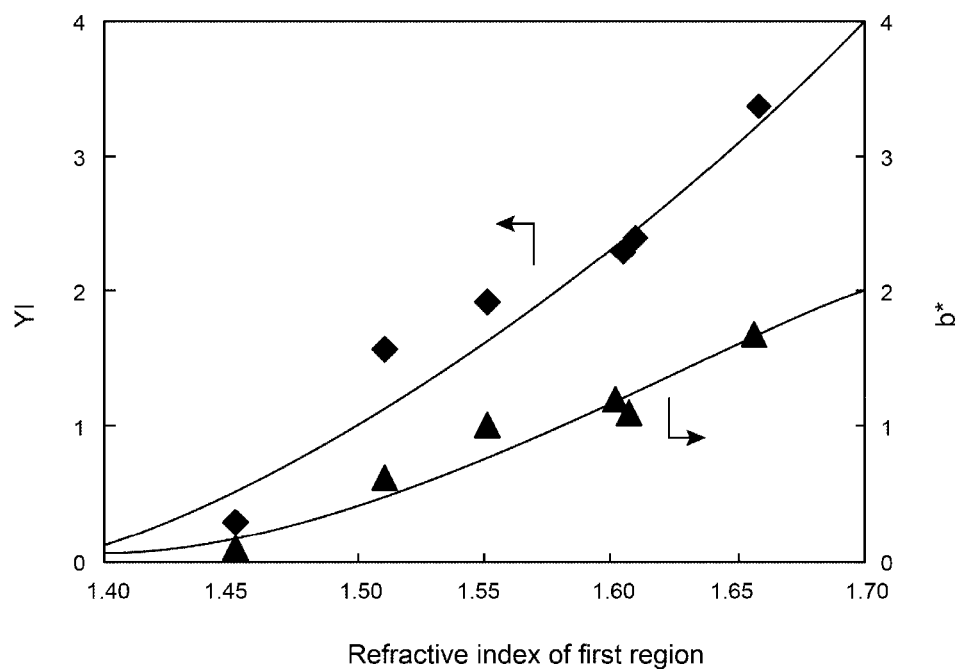
FIG. 2 is a diagram provided to illustrate the respective relationships of the refractive index of the first region in the gas barrier layers of Examples and Comparative Example, to YI and to b*, respectively.

Furthermore, FIG. 2 is a diagram illustrating the relationship of the refractive index of the first region in the gas barrier layers of Examples and Comparative Example, to YI and to b*.

That is, in FIG. 2, the horizontal axis represents the values of the refractive index of the first region of the gas barrier layer in the gas barrier films of Examples and Comparative Example; the left vertical axis represents the values of YI in the gas barrier film; and the right vertical axis represents the values of b* in the gas barrier film.

As can be understood from such FIG. 2, there was observed a tendency that as the value of the refractive index of the first region increases, the value of YI increases significantly, and the gas barrier film is colored.

Therefore, it is understood that the value of YI can be suppressed to a considerably low value of about 1.0 to 4.0, by adjusting the value of such refractive index in the first region to a value within the range of 1.50 to 1.68.

On the other hand, as illustrated in FIG. 2, there was observed a tendency that as the value of the refractive index of the first region in the gas barrier layer increases, the value of b* gradually increases, and therefore, the gas barrier film is slightly colored.

Therefore, the value of b* can be suppressed to a considerably low value of about 0.4 to 1.8, by adjusting such refractive index in the first region to a value within the range of 1.50 to 1.68.

Therefore, it is understood that when the refractive index in the first region has a value within the range of 1.50 to 1.68, as described above, a gas barrier film which has a low water vapor transmission rate (WVTR), has excellent gas barrier properties, and has excellent transparency, with suppressed coloration, can be obtained.

Meanwhile, regarding the refractive index of the first region, an average value of the refractive indices in a region extending from the surface of the gas barrier layer to 30 nm can be employed, or the refractive index at a position about 10 nm away from the surface side toward the base material side can be employed as a representative value thereof.

Furthermore, regarding the refractive index of the second region, an average value of the refractive index in a region extending from the surface of the gas barrier layer to the range of 30 nm to 100 nm can be employed, or the refractive index at a position about 50 nm away from the surface can be employed as a representative value thereof.

Furthermore, in FIG. 6 and FIGS. 10 to 13, the first region and the second region are indicated with arrows, but these are only tentative indications for easy understanding, and the sizes of the arrows indicating the thicknesses of these regions may increase or decrease.

The refractive index of such a first region or second region can be appropriately adjusted according to the kind of the polysilazane compound that will be described below, the conditions for ion implantation, and the like.

(2) Film Density

Furthermore, it is preferable to adjust the film density in the first region to a value within the range of 2.3 g/cm$^3$ to 3.0 g/cm$^3$.

Furthermore, it is preferable to adjust the film density in the second region to a value of from 1.5 g/cm$^3$ to below 2.3 g/cm$^3$.

The reason for this is that when the film densities of the respective regions are limited as such, superior transparency or excellent gas barrier properties expected as a gas barrier film can be obtained, or favorable flexibility that does not bring about the generation of cracks even if the gas barrier film is considerably bent, can be obtained.

Therefore, it is more preferable to adjust the film density in the first region to a value within the range of 2.4 g/cm$^3$ to 2.9 g/cm$^3$, and to adjust the film density in the second region to a value within the range of 1.8 g/cm$^3$ to 2.2 g/cm$^3$; and it is even more preferable to adjust the film density in the first region to a value within the range of 2.5 g/cm$^3$ to 2.8 g/cm$^3$, and to adjust the film density in the second region to a value within the range of 1.9 g/cm$^3$ to 2.1 g/cm$^3$.

Figure 3:
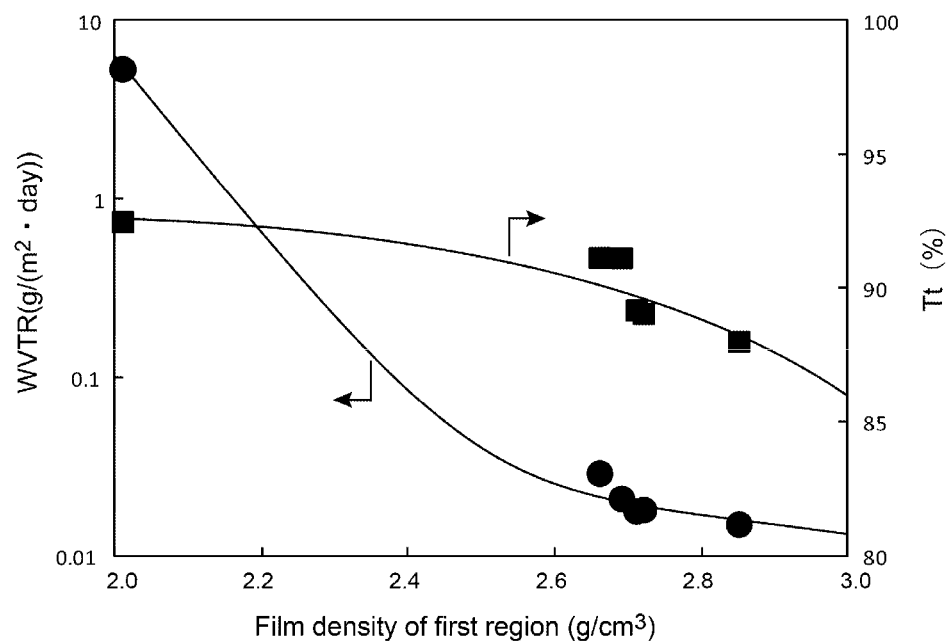
FIG. 3 is a diagram provided to illustrate the relationships of the film density of the first region in the gas barrier layers of Examples and Comparative Example, to WVTR and to Tt, respectively.
Figure 4:
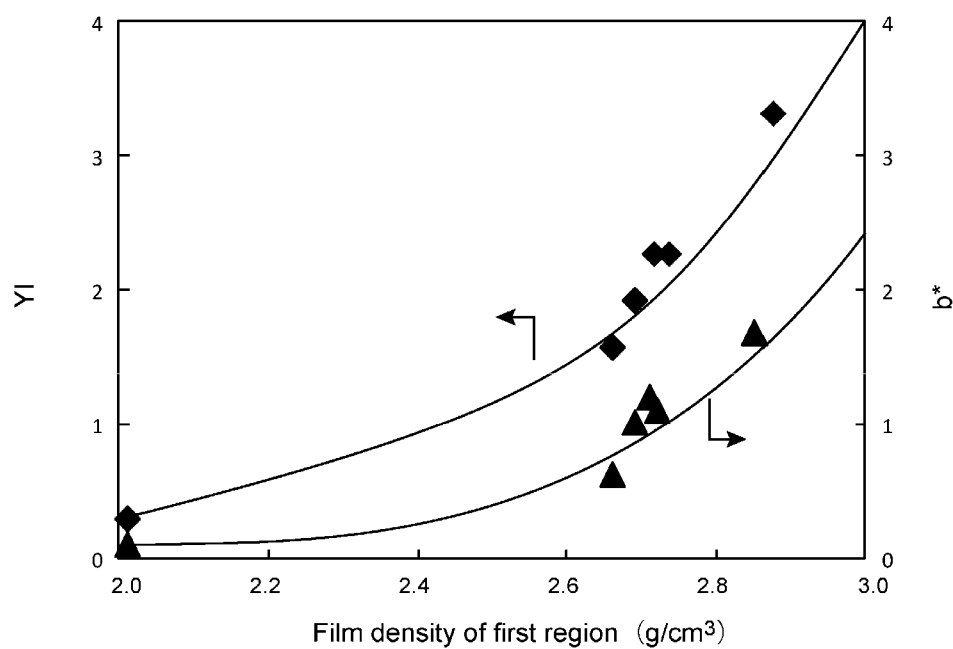
FIG. 4 is a diagram provided to illustrate the relationships of the film density of the first region in the gas barrier layers of Examples and Comparative Example, to YI and to b*, respectively.

Next, the relationships of the film density of the first region in the gas barrier layer to WVTR, Tt, YI and b* will be respectively mentioned with reference to FIG. 3 and FIG. 4.

FIG. 3 is a diagram illustrating the relationship of the film density of the first region in the gas barrier layers of Examples and Comparative Examples, to WVTR and Tt.

That is, in FIG. 3, the horizontal axis represents the values of the film density of the first region of the gas barrier layer in the gas barrier films of Examples and Comparative Example; the left vertical axis represents the values of WVTR (g/(m$^2$·day)) in the gas barrier film; and the right vertical axis represents the values of Tt (%) in the gas barrier film.

As can be understood from such FIG. 3, there was observed a tendency that as the value of the film density of the first region in the gas barrier layer increases, the value of WVTR decreases significantly, and the gas barrier properties are enhanced.

Therefore, a considerably low value of WVTR of about 0.01 g/(m$^2$·day) to 0.1 g/(m$^2$·day) is obtained by adjusting such film density in the first region to a value within the range of 2.3 g/cm$^3$ to 3.0 g/cm$^3$.

On the other hand, as illustrated in FIG. 3, there was observed a tendency that as the value of the film density of the first region in the gas barrier layer increases, the value of Tt gradually decreases, and light transmissibility is slightly decreased.

Therefore, a very high value of Tt of about 88% to 92% can be obtained by adjusting such film density in the first region to a value within the range of 2.3 g/cm$^3$ to 3.0 g/cm$^3$.

Therefore, a gas barrier layer having a low water vapor transmission rate (WVTR), and having excellent gas barrier properties as well as superior transparency is obtained by adjusting the film density in the first region to a value within the range of 2.3 g/cm$^3$ to 3.0 g/cm$^3$.

Furthermore, FIG. 4 is a diagram illustrating the relationships of the film density of the first region in the gas barrier layers of Examples and Comparative Examples, to YI and b*. That is, in FIG. 4, the horizontal axis represents the values of the film density of the first region in the gas barrier layer in the gas barrier films of Examples and Comparative Example; the left vertical axis represents the values of YI in the gas barrier film; and the right vertical axis represents the values of b* in the gas barrier film.

As can be understood from such FIG. 4, there was observed a tendency that as the value of the film density of the first region in the gas barrier layer increases, the value of YI increases exponentially, and therefore, the gas barrier film is colored.

Therefore, when such film density in the first region is adjusted to a value within the range of 2.3 g/cm$^3$ to 3.0 g/cm$^3$, the YI has a value of about 0.5 to 4.0.

On the other hand, as illustrated in FIG. 4, there was observed a tendency that as the value of the film density of the first region in the gas barrier layer increases, the value of b* also increases significantly, and therefore, the gas barrier film is colored.

Therefore, the value of b* can be adjusted to a value within the range of about 0.1 to 2.5, by adjusting such film density in the first region to a value within the range of 2.3 g/cm$^3$ to 3.0 g/cm$^3$.

Therefore, when the film density in the first region has a value within the range of 2.3 g/cm$^3$ to 3.0 g/cm$^3$, as described above, a gas barrier film having a low water vapor transmission rate (WVTR) and having excellent gas barrier properties as well as transparency, with a low value of YI or b* and suppressed coloration, can be obtained.

(3) Thickness

Furthermore, it is preferable to adjust the thickness of the first region to a value within the range of 10 nm to 30 nm, and to adjust the thickness of the second region to a value within the range of 10 nm to 500 nm.

The reason for this is that when the thicknesses of the various regions are limited as such, and also, the refractive indices thereof are adjusted as described above, superior gas barrier properties, transparency and the like can be obtained, and at the same time, favorable flexibility that does not bring about the generation of cracks even if the gas barrier film is considerably bent, can be obtained.

Further, it is usually preferable to adjust the thickness of the gas barrier layer including the first region and the second region (total thickness) to a value within the range of 20 nm to 530 nm.

The reason for this is that superior gas barrier properties, mechanical characteristics and the like can be obtained by limiting the thickness of the gas barrier layer as such.

Therefore, it is more preferable to adjust the thickness of the gas barrier layer including the first region and the second region to a value within the range of 20 nm to 500 nm, and even more preferably to a value within the range of 25 nm to 300 nm.

(4) XPS Analysis 1

(First Region)

In regard to the first region, when the amount of oxygen measured by XPS is designated as X mol %, the amount of nitrogen is designated as Y mol %, and the amount of silicon is designated as Z mol %, it is preferable to adjust the ratio X/Z (ratio of the amount of oxygen to the amount of silicon) to a value within the range of 1.0 to 2.5, and to adjust the ratio Y/Z (ratio of the amount of nitrogen to the amount of silicon) to a value within the range of 0 to 0.5.

The reason for this is that in regard to the first region, when the ratio of the amount of oxygen to the amount of silicon is set to be higher than the ratio of the amount of nitrogen to the amount of silicon, and the ratio of the amount of nitrogen to the amount of silicon is set to be lower, excellent gas barrier properties are obtained, and also, very high transparency can be obtained, while coloration is suppressed.

Therefore, it is more preferable to adjust the ratio of X/Z in the first region to a value within the range of 1.5 to 2.5, and to adjust the ratio of Y/Z to a value within the range of 0.01 to 0.4; and it is even more preferable to adjust the ratio of X/Z to a value within the range of 2.0 to 2.5, and to adjust the ratio of Y/Z to a value within the range of 0.02 to 0.3.

In regard to the first region and the second region, it is not necessary that the composition ratios be constant as long as the composition ratios fall in the ranges described above, and a state in which there exists a portion where the compositions of the respective regions change continuously or stepwise, is also acceptable.

Furthermore, in regard to the first region, it is preferable that when the amount of oxygen measured by XPS is designated as X mol %, and the amount of silicon is designated as Z mol %, the change curve of the ratio X/Z has a minimum point. That is, it is preferable that the ratio of X/Z change so as to first decrease from the surface side toward the base material, and then to increase.

The reason for this is that when the gas barrier film is configured as such, excellent gas barrier properties are obtained, and also, very high transparency can be obtained stably.

On the other hand, in regard to the first region, it is preferable that when the amount of nitrogen measured by XPS is designated as Y mol %, and the amount of silicon is designated as Z mol %, the change curve of the ratio Y/Z have a maximum point. That is, it is preferable that the ratio of Y/Z change so as to first increase from the surface side toward the base material side, and then to decrease.

The reason for this is that when the gas barrier film is configured as such, excellent gas barrier properties are obtained, and also, very high transparency can be obtained stably.

(Second Region)

Furthermore, in regard to the second region, when the amount of oxygen measured by XPS is designated as X mol %, and the amount of silicon is designated as Z mol %, it is preferable to adjust the ratio of X/Z to a value within the range of 2.0 to 2.5.

Thereby, the value of the refractive index of the second region can be adjusted to a value within the range of 1.40 to below 1.50, and gas barrier properties can be obtained.

(5) XPS Analysis 2

(First Region)

In regard to the first region, it is preferable to adjust the amount of silicon measured by an XPS analysis to a value within the range of 25 mol % to 45 mol %, to adjust the amount of oxygen to a value within the range of 54 mol % to 74 mol %, and to adjust the amount of nitrogen to a value within the range of 0.1 mol % to 15 mol %, relative to the total amount of the amount of silicon, the amount of oxygen, and the amount of nitrogen.

The reason for this is that when the amount of silicon in the first region has a value of below 25 mol %, the amount of oxygen or the amount of nitrogen increases relatively so that the balance of the incorporated components is destroyed, and mechanical strength or transparency may be decreased excessively.

On the other hand, when the amount of silicon in the first region has a value of above 45 mol %, the amount of oxygen or the amount of nitrogen decreases relatively so that the balance of the incorporated components is destroyed, and the gas barrier properties may be decreased excessively.

Therefore, in regard to the first region, it is more preferable to adjust the amount of silicon measured by XPS to a value within the range of 28 mol % to 44 mol %, and even more preferably to a value within the range of 30 mol % to 40 mol %, relative to the total amount of the amount of silicon, the amount of oxygen, and the amount of nitrogen.

Furthermore, it is because when the amount of oxygen in the first region has a value of below 54 mol %, the amount of silicon or the amount of nitrogen increases relatively so that the balance of the incorporated components is destroyed, and mechanical strength may be decreased, or transparency may be decreased, while the refractive index may be increased, or reflectance may be increased.

On the other hand, it is because when the amount of oxygen in the first region has a value of above 74 mol %, the amount of silicon or the amount of nitrogen may decrease relatively so that the balance of the incorporated components is destroyed, and the gas barrier properties may be decreased excessively.

Therefore, in regard to the first region, it is more preferable to adjust the amount of oxygen measured by an XPS analysis to a value within the range of 60 mol % to 73 mol %, and even more preferably to a value of 64 mol % to 72 mol %, relative to the total amount of the amount of silicon, the amount of oxygen, and the amount of nitrogen.

Furthermore, it is because when the amount of nitrogen in the first region has a value of below 0.1 mol %, the amount of oxygen or the amount of silicon increases relatively so that the balance of the incorporated components is destroyed, and the gas barrier properties may be decreased excessively.

On the other hand, it is because when the amount of nitrogen in the first region has a value of above 15 mol %, the amount of oxygen or the amount of silicon decreases relatively so that the balance of the incorporated components is destroyed, and mechanical strength may be decreased, or transparency may be decreased, while the refractive index may be increased, or the reflectance may be increased.

Therefore, in regard to the first region, it is more preferable to adjust the amount of nitrogen measured by an XPS analysis to a value within the range of 0.2 mol % to 7 mol %, and even more preferably to a value within the range of 0.5 mol % to 5 mol %, relative to the total amount of the amount of silicon, the amount of oxygen, and the amount of nitrogen.

(Second Region)

Furthermore, in regard to the second region, it is preferable to adjust the amount of silicon measured by an XPS analysis to a value within the range of 25 mol % to 50 mol %, to adjust the amount of oxygen to a value within the range of 20 mol % to 70 mol %, and to adjust the amount of nitrogen to a value within the range of 0.01 mol % to 30 mol %, relative to the total amount of the amount of silicon, the amount of oxygen, and the amount of nitrogen.

The reason for this is that when the amount of silicon in the second region has a value of below 25 mol %, the amount of oxygen or the amount of nitrogen increases relatively so that the balance of the incorporated components is destroyed, and mechanical strength or transparency may be decrease excessively.

On the other hand, it is because when the amount of silicon in the second region has a value of above 50 mol %, the amount of oxygen or the amount of nitrogen decreases relatively so that the balance of the incorporated components is destroyed, and the gas barrier properties may be decreased excessively.

Therefore, in regard to the second region, it is more preferable to adjust the amount of silicon measured by an XPS analysis to a value within the range of 28 mol % to 45 mol %, and even more preferable to a value within the range of 30 mol % to 40 mol %, relative to the total amount of the amount of silicon, the amount of oxygen, and the amount of nitrogen.

Furthermore, it is because when the amount of oxygen in the second region has a value of below 20 mol %, the amount of silicon or the amount of nitrogen increases relatively so that the balance of the incorporated components is destroyed, and mechanical strength may be decreased excessively, or transparency may be decreased.

On the other hand, it is because when the amount of oxygen in the second region has a value of above 70 mol %, the amount of silicon or the amount of nitrogen decreases relatively so that the balance of the incorporated components is destroyed, and gas barrier properties may be decreased excessively.

Therefore, in regard to the second region, it is more preferable to adjust the amount of oxygen measured by an XPS analysis to a value within the range of 25 mol % to 69.5 mol %, and even more preferable to a value within the range of 30 mol % to 69 mol %, relative to the total amount of the amount of silicon, the amount of oxygen, and the amount of nitrogen.

Furthermore, it is because when the amount of nitrogen in the second region has a value of below 0.01 mol %, the amount of silicon or the amount of oxygen increases relatively so that the balance of the incorporated components is destroyed, and the gas barrier properties may be decreased excessively.

On the other hand, it is because when the amount of nitrogen in the second region has a value of above 30 mol %, the amount of silicon or the amount of oxygen decreases relatively so that the balance of the incorporated components is destroyed, mechanical strength or transparency may be decreased excessively.

Therefore, in regard to the second region, it is more preferable to adjust the amount of nitrogen measured by an XPS analysis to a value within the range of 0.5 mol % to 29 mol %, and even more preferable to a value within the range of 1 mol % to 28 mol %, relative to the total amount of the amount of silicon, the amount of oxygen, and the amount of nitrogen.

2. Base Material

The kind of the base material is not particularly limited as long as the base material has excellent transparency, and glass, ceramics, thermoplastic resin films (a polyester film such as a polyethylene terephthalate film, a polyolefin film, a polycarbonate film, and the like), thermosetting resin films (an epoxy resin film, a silicone resin film, a phenolic resin film, and the like), photocurable resin films (a photocurable acrylic resin film, a photocurable urethane resin film, a photocurable epoxy resin film, and the like), and the like may be used singly, or in combination of two or more kinds thereof.

Furthermore, the thickness of the base material is also not particularly limited, and it is usually preferable to adjust the thickness to a value within the range of 1 μm to 1000 μm, and more preferable to a value within the range of 10 μm to 100 μm.

3. Gas Barrier Film

Furthermore, the gas barrier film according to the first exemplary embodiment has a gas barrier layer having the base material, the first region, and the second region described above.

Figure 5:
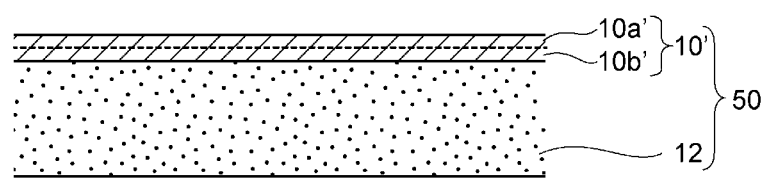
FIG. 5 is a schematic diagram provided to explain a cross-section of the gas barrier film of the present invention.
Figure 6A:
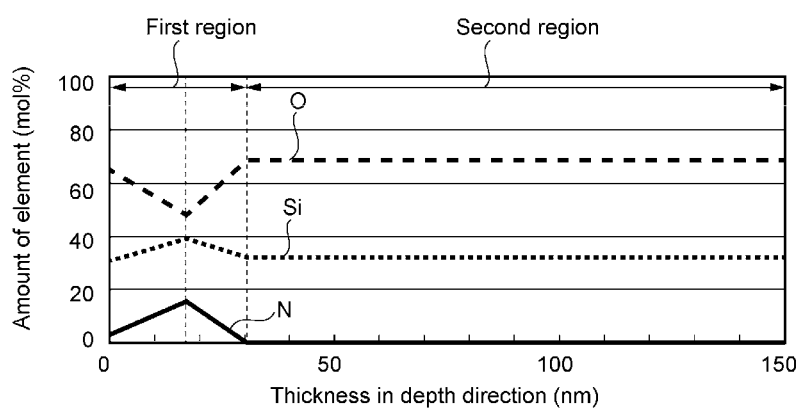
FIG. 6(a) is a diagram provided to illustrate the amounts of elements (amount of nitrogen, amount of silicon, and amount of oxygen) measured by an XPS analysis on the thickness in the depth direction of the gas barrier layer in the gas barrier film of Example 1.
Figure 6B:
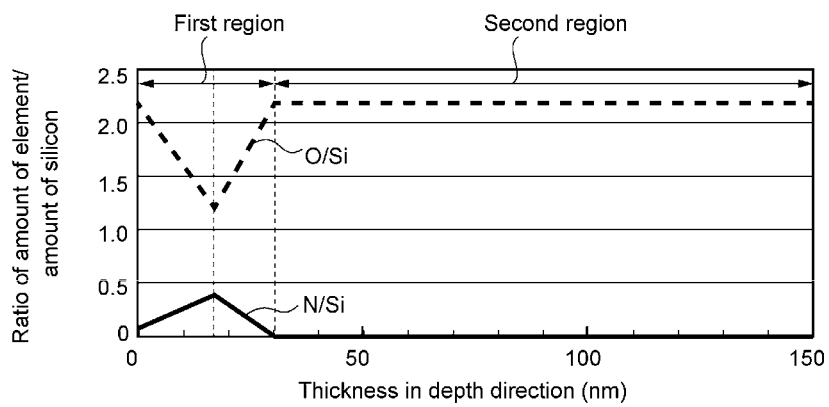
FIG. 6(b) is a diagram provided to illustrate the relationships of the ratio of amount of oxygen/amount of silicon (X/Z) and the ratio of amount of nitrogen/amount of silicon (Y/Z).

As illustrated in FIG. 5, the gas barrier film according to the first exemplary embodiment is, for example, a gas barrier film 50 having, on a base material 12, a gas barrier layer 10' having a second region 10b' and a first region 10a'. The gas barrier film is such that, as illustrated in FIG. 5, the gas barrier layer 10' may be a single layer, or a plural number of the gas barrier layer 10' may be laminated, although not shown in the diagram.

Furthermore, two or more sheets of the gas barrier film 50 may also be bonded together with an adhesive or the like. In this case, the surface to be bonded is not particularly limited, but from the viewpoint of protecting the surface of the gas barrier layer 10' and preventing deterioration of the gas barrier properties, it is preferable to bond a gas barrier layer 10' with another gas barrier layer 10' using an adhesive or the like.

4. Total Light Transmittance (Tt)

Furthermore, it is preferable to have the total light transmittance of the gas barrier film adjusted to a value of 88% or more.

The reason for this is that very high transparency may be obtained by having a total light transmittance of the gas barrier film of such a value.

Therefore, it is more preferable to adjust the total light transmittance of the gas barrier film to a value within the range of 89% to 99%, and even more preferably to a value within the range of 90% to 97%.

5. Yellowness Index (YI) and b*

It is also preferable to have the yellowness index of the gas barrier film adjusted to a value of 4 or less.

The reason for this is that by having a yellowness index of such a value, a gas barrier film with suppressed coloration is obtained, and the gas barrier film can be applied as a film that constitutes a device having a display function for organic EL elements or for touch panels.

Therefore, it is more preferable to adjust the yellowness index (YI) of the gas barrier film to a value within the range of 1 to 3.5, and even more preferably to a value within the range of 1.5 to 2.5.

Furthermore, b* (chromaticness index on the b* axis in the CIE1976 L*a*b* color system) of the gas barrier film is preferably within the range of −2.0 to 2.0, and more preferably within the range of −1.5 to 1.5.

6. Water Vapor Transmission Rate (WVTR)

Furthermore, it is preferable to adjust the water vapor transmission rate of the gas barrier film to a value of 0.050 g/(m²·day) or less.

The reason for this is that by having a water vapor transmission rate of such a value, excellent gas barrier properties are obtained.

Therefore, it is more preferable to adjust the value of the water vapor transmission rate of the gas barrier film to a value within the range of 0.0001 g/(m²·day) to 0.04 g/(m²·day), and even more preferably to a value within the range of 0.0001 g/(m²·day) to 0.03 g/(m²·day).

7. Other Layers

The gas barrier film of the present invention may also be provided with various other layers as necessary.

Examples of such other layers include a primer layer provided to enhance the adhesiveness between the base material and the gas barrier layer, a flattening layer, a conductive layer, a hard coat layer, a protective layer, an antistatic layer, an antifouling layer, an antiglare layer, a color filter, an adhesive layer, a decorative layer, a print layer, and other gas barrier layers and the like.

Second Exemplary Embodiment

A second exemplary embodiment is a method for producing a gas barrier film having a gas barrier layer on a base material, the method including the following steps (1) to (3):

(1) a polysilazane layer forming step of forming a polysilazane layer on a base material;

(2) a seasoning step of performing seasoning of the polysilazane layer; and (3) an ion implantation step of implanting ions into the polysilazane layer, and forming a gas barrier layer having a first region having a refractive index of a value within the range of 1.50 to 1.68, and a second region having a refractive index of a value within the range of 1.40 to below 1.50.

1. Step (1): Polysilazane Layer Forming Step

Figure 7A:
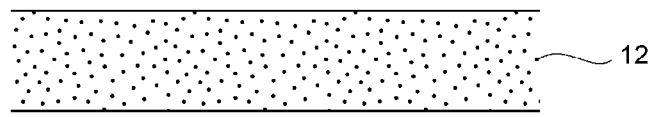
FIGS. 7(a) to 7(e) are diagrams provided to illustrate the method for producing a gas barrier film of the present invention.
Figure 7B:
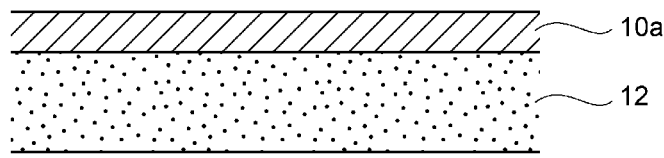
Figure 7C:
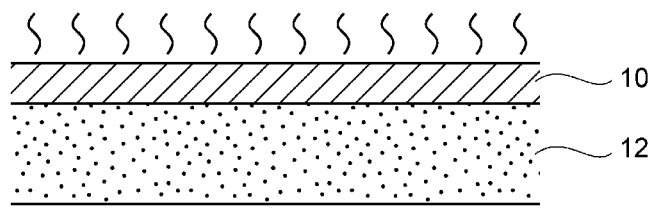

Step (1) is a step of preparing a base material 12 for which it is desired to impart gas barrier properties, as illustrated in FIG. 7(a); forming a polysilazane layer 10a on the prepared base material 12, as illustrated in FIG. 7(b); and then performing a seasoning treatment to obtain a polysilazane layer 10 prior to an ion implantation process, as illustrated in FIG. 7(c).

(1) Polysilazane Compound

The polysilazane compound for forming a polysilazane layer is a polymer compound having a repeating unit containing a —Si—N— bond (silazane bond) in the molecule, and any known compound such as an organic polysilazane, an inorganic polysilazane, or a modified polysilazane can be used.

Furthermore, regarding the polysilazane compound, those commercially available compounds can be used directly. The polysilazane compound is, among those described above, preferably an inorganic polysilazane, and particularly a perhydropolysilazane. With a perhydropolysilazane, a gas barrier layer having a region with a predetermined refractive index can be obtained easily.

(2) Polysilazane Layer Forming Method

Furthermore, the method of forming a polysilazane layer is not particularly limited, and any known method can be used. Examples include a method of forming a polysilazane layer on a base material by a known coating method such as a screen printing method, a knife coating method, a roll coating method, a die coating method, an inkjet method, or a spin coating method; and a method of bringing a base material into contact with a gas of a plasma polymerizable silazane compound, and subjecting the base material to a plasma polymerization treatment to form a polysilazane layer and the like.

Among them, in order to be able to form a polysilazane layer having a uniform thickness, it is preferable to form a polysilazane layer by blending an organic solvent, applying a coating liquid of a polysilazane compound on a base material or the like by a known coating method such as a screen printing method, a knife coating method, a roll coating method, a die coating method, an inkjet method, or a spin coating method, and drying the coating liquid.

Furthermore, for the base material to be used, the same matters as those described above for the gas barrier film can be applied.

2. Step (2): Seasoning Step

Furthermore, the seasoning step is a step of subjecting the base material on which the polysilazane layer 10a has been formed, to a seasoning treatment under predetermined conditions, and obtaining a polysilazane layer 10 prior to an ion implantation process, as illustrated in FIG. 7(c).

Here, the seasoning conditions are preferably treatment conditions including a temperature of 15° C. to 35° C. and a treatment time of 24 hours to 480 hours, and more preferably treatment conditions including a temperature of 20° C. to 30° C. and a treatment time of 48 hours to 240 hours.

That is, it is because when the temperature and treatment time of the seasoning conditions are adjusted to these ranges, the composition ratio of the gas barrier layer obtainable after the subsequent ion implantation step can be adjusted stably, and thus excellent gas barrier properties can be obtained.

Furthermore, it is preferable to adjust the refractive index of the polysilazane layer 10 to a value within the range of 1.48 to 1.63, by the seasoning process.

The reason for this is that when the refractive index of the polysilazane layer 10 is limited to a value within the predetermined range, in a case in which a gas barrier film including a gas barrier layer originating from a polysilazane layer has been obtained by the ion implantation process of step (3), excellent gas barrier properties, transparency and the like can be obtained.

That is, when the refractive index of the polysilazane layer 10 has a value of below 1.48, the gas barrier properties of the gas barrier layer obtainable after the ion implantation process may be deteriorated, and when the refractive index has a value of above 1.63, transparency of the gas barrier layer obtainable after the ion implantation process may be decreased.

Therefore, it is more preferable to adjust the refractive index of the polysilazane layer 10 to a value within the range of 1.49 to 1.59, and even more preferably to a value within the range of 1.50 to 1.58, by the seasoning process.

3. Step (3): Ion Implantation Step (1) Basic Method

Figure 7D:
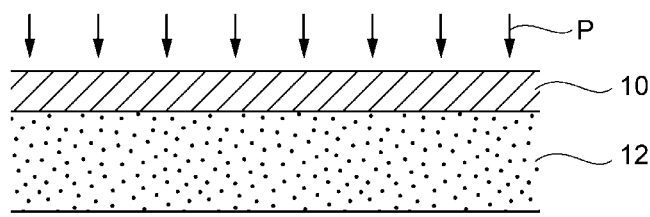
Figure 7E:
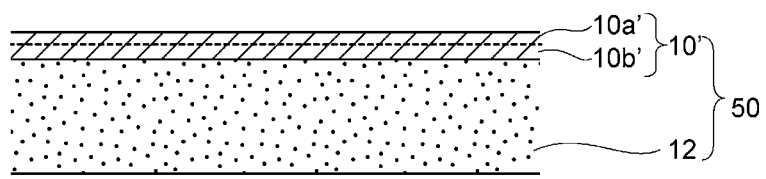

Step (3) is a step of performing ion implantation into the polysilazane layer 10, as illustrated in FIG. 7(d), implanting ions that exist in a plasma generated using an external electric field as indicated with an arrow P; and finally obtaining a gas barrier film 50 having a predetermined gas barrier layer 10', as illustrated in FIG. 7(e).

More specifically, the ion implantation step is preferably a process of generating a plasma in an atmosphere containing a plasma-producing gas such as a noble gas, applying a negative high voltage pulse, and thereby implanting ions (plasma ions) in the plasma into the surface of the polysilazane layer (plasma ion implantation process).

Meanwhile, in FIG. 7(e), the boundary region of the first region 10a' and the second region 10b' is indicated with a dotted line, so that the positions of formation of the first region 10a' and the second region 10b' formed in the gas barrier layer 10' as a single layer can be understood easily.

Furthermore, examples of the method of performing plasma ion implantation include a method of implanting ions that exist in a plasma generated using an external electric field, to the polysilazane layer 10; and a method implanting ions that exist in a plasma generated only with an electric field caused by a negative high voltage pulse applied to the polysilazane layer 10 without using an external electric field, into the polysilazane layer 10.

Furthermore, when the ions in plasma are implanted into the polysilazane layer, a known plasma ion implantation apparatus can be used, and for example, the plasma ion implantation apparatuses described in JP-A No. 2001-26887, JP-A No. 2001-156013, and WO 2010/021326 can be used.

Figure 8:
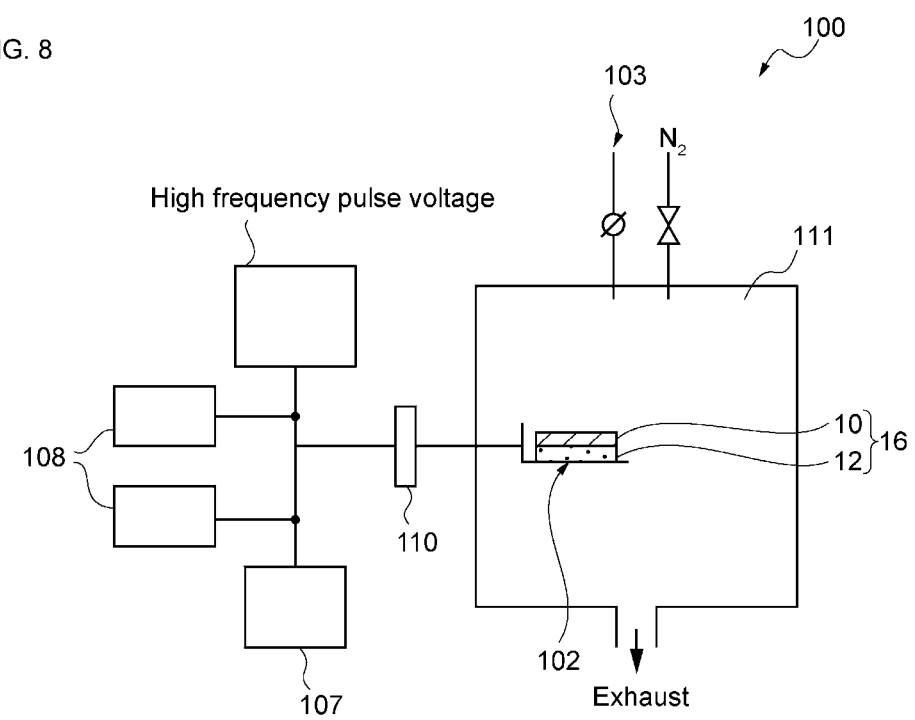
FIG. 8 is a diagram provided to illustrate an example of an ion implantation apparatus.
Figure 9A:
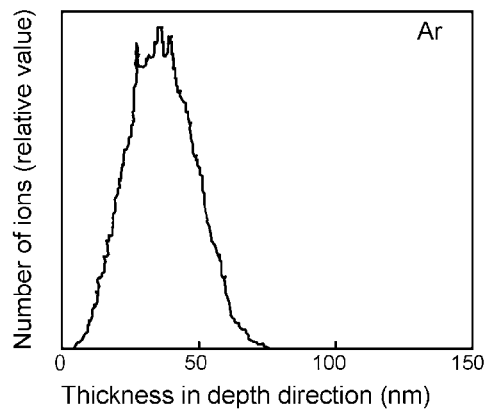
FIGS. 9(a) to 9(f) are diagrams provided to illustrate the relationship between the thickness (nm) in the depth direction and the number of ions obtained by the Monte Carlo simulation, for ion species (Ar, Kr, He, N, Ne, and O).
Figure 9B:
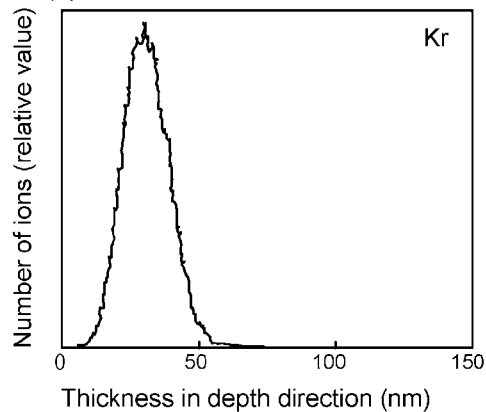
Figure 9C:
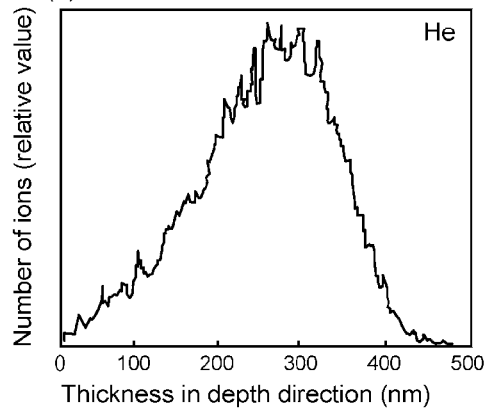
Figure 9D:
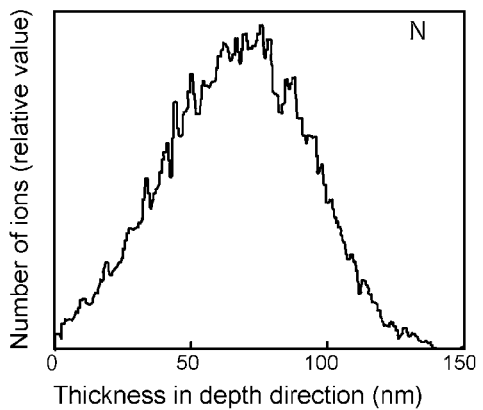
Figure 9E:
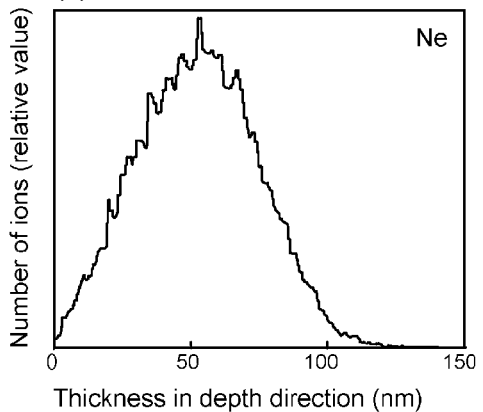
Figure 9F:
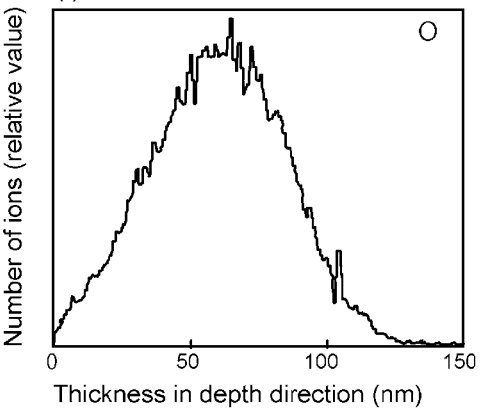
Figure 10A:
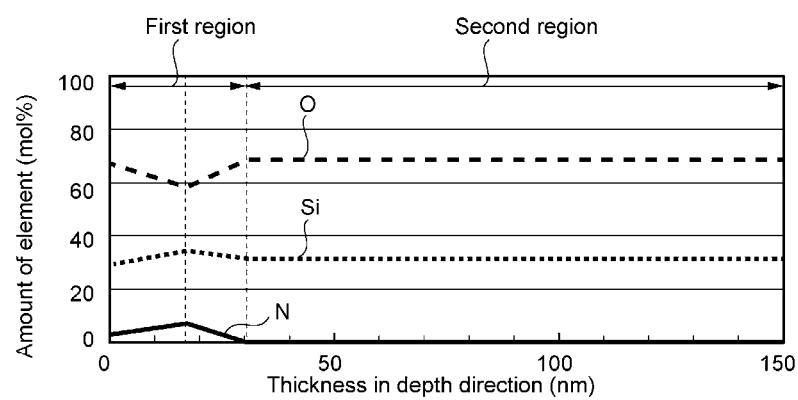
FIG. 10(a) is a diagram provided to illustrate the relationship between the thickness in the depth direction and the amounts of elements (amount of nitrogen, amount of silicon, and amount of oxygen) measured by an XPS analysis, for the gas barrier layer in the gas barrier film of Example 2.
Figure 10B:
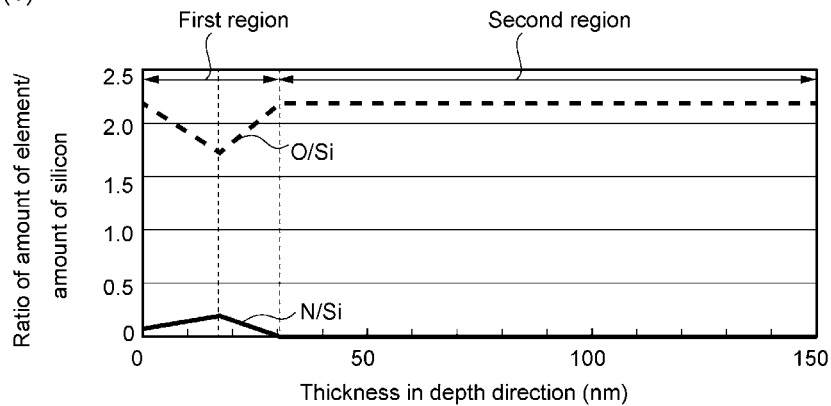
FIG. 10(b) is a diagram provided to illustrate the relationships of the thickness in the depth direction to the ratio of amount of oxygen/amount of silicon (X/Z) and to the ratio of amount of nitrogen/amount of silicon (Y/Z).
Figure 11A:
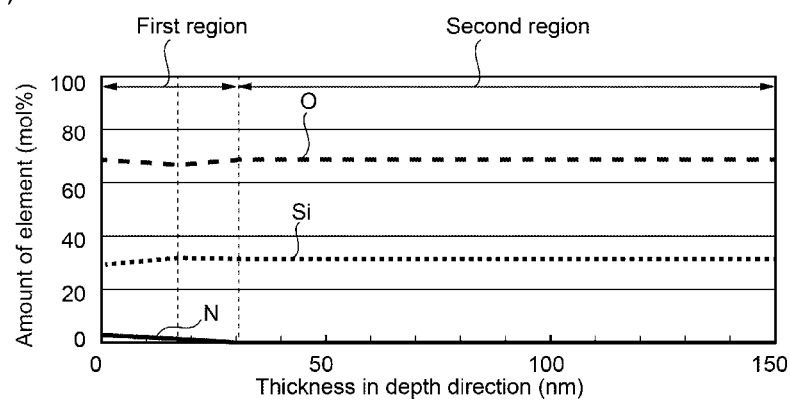
FIG. 11(a) is a diagram provided to illustrate the relationship between the thickness in the depth direction and the amounts of elements (amount of nitrogen, amount of silicon, and amount of oxygen) measured by an XPS analysis, for the gas barrier layer in the gas barrier film of Example 3.
Figure 11B:
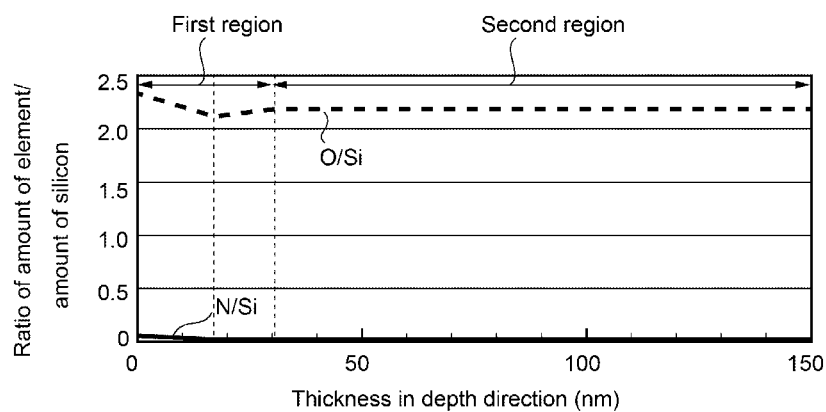
FIG. 11(b) is a diagram provided to illustrate the relationship of the thickness in the depth direction to the ratio of amount of oxygen/amount of silicon (X/Z) and to the ratio of amount of nitrogen/amount of silicon (Y/Z).
Figure 12A:
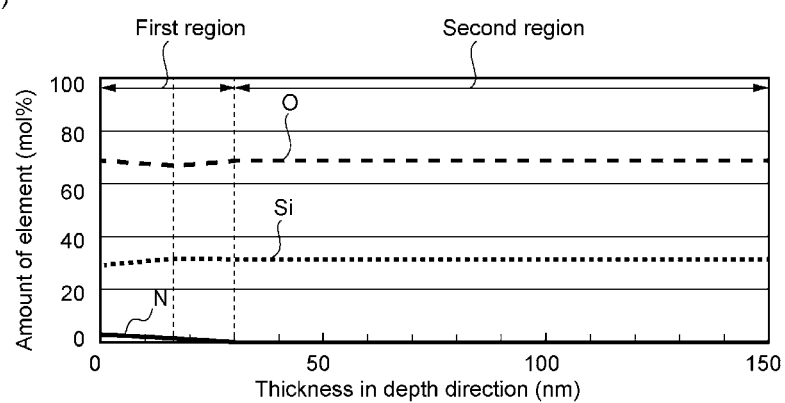
FIG. 12(a) is a diagram provided to illustrate the relationship between the thickness in the depth direction and the amounts of elements (amount of nitrogen, amount of silicon, and amount of oxygen) measured by an XPS analysis, for the gas barrier layer in the gas barrier film of Example 4.
Figure 12B:
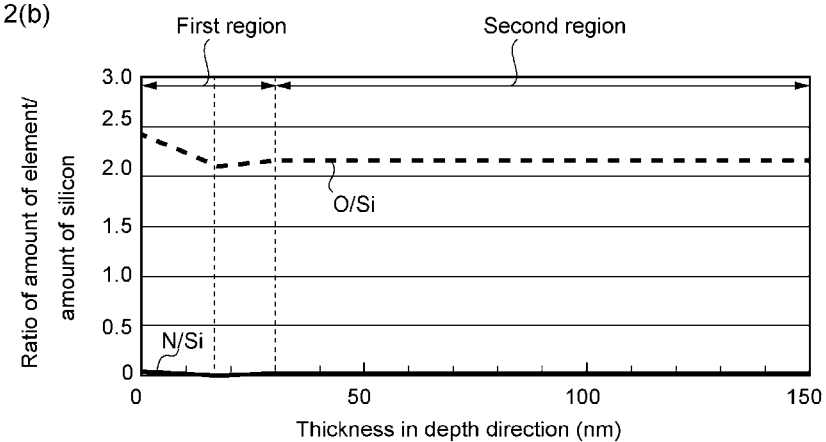
FIG. 12(b) is a diagram provided to illustrate the relationship of the thickness in the depth direction to the ratio of amount of oxygen/amount of silicon (X/Z) and to the ratio of amount of nitrogen/amount of silicon (Y/Z).
Figure 13A:
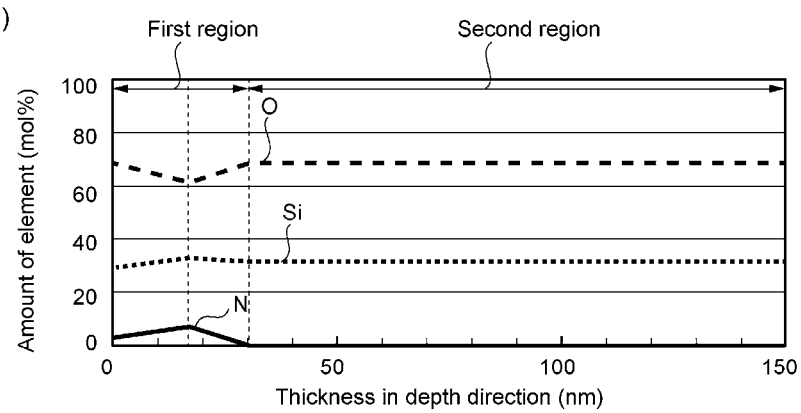
FIG. 13(a) is a diagram provided to illustrate the relationship between the thickness in the depth direction and the amounts of elements (amount of nitrogen, amount of silicon, and amount of oxygen) measured by an XPS analysis, for the gas barrier layer in the gas barrier film of Example 5.
Figure 13B:
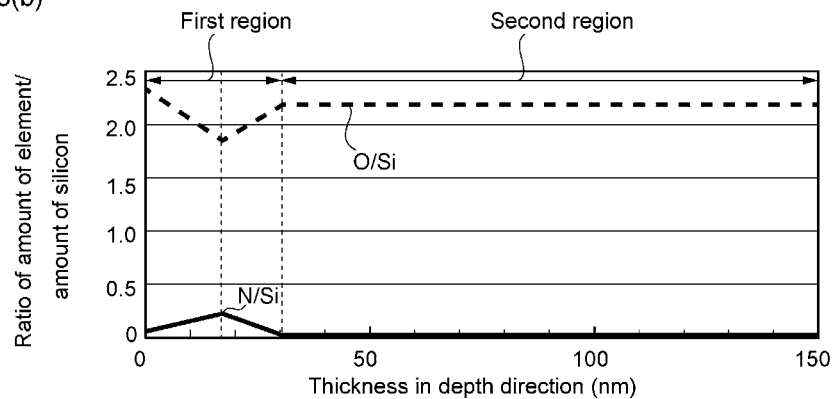
FIG. 13(b) is a diagram provided to illustrate the relationship of the thickness in the depth direction to the ratio of amount of oxygen/amount of silicon (X/Z) and to the ratio of amount of nitrogen/amount of silicon (Y/Z).

As an example, a plasma ion implantation apparatus 100 illustrated in FIG. 8 can be used.

That is, such a plasma ion implantation apparatus 100 basically includes a vacuum chamber 111, a microwave power supply (not shown in the diagram), a magnet coil (not shown in the diagram), and a direct current application apparatus (pulse power supply) 108.

The vacuum chamber 111 is a vessel intended for disposing a base material film 16 in which the polysilazane layer 10 has been formed on the base material 12 as an object to be treated (hereinafter, may be simply referred to base material 16), at a predetermined position inside the vacuum chamber, and implanting ions originating from a predetermined gas that has been introduced through a gas inlet port 103, into the base material film 16.

Furthermore, the direct current application apparatus 108 is a direct current power supply equipped with an oscilloscope 107, and is a pulse power supply for applying a high voltage pulse to the base material film 16 as an object to be treated.

Therefore, the direct current application apparatus 108 is electrically connected to a conductor 102 on which the base material film 16 as an object to be treated is disposed.

Therefore, when a plasma ion implantation apparatus 100 configured as such is used, plasma of a predetermined gas is generated around the conductor 102 and the base material film 16, by driving the microwave power supply (electrode for plasma discharge) and the magnet coil.

Subsequently, after the passage of a predetermined time period, the direct current application apparatus 108 is driven simultaneously with termination of the driving of the microwave power supply and the magnet coil, and a predetermined high voltage pulse (negative voltage) is applied to the base material film 16 as an object to be treated, through a high voltage input terminal 110 and the conductor 102.

Therefore, an ion species (nitrogen ion or the like) in the plasma is induced by the application of such a high voltage pulse (negative voltage), and a gas barrier film having at least a gas barrier layer on the surface can be obtained by implanting the ion species into the polysilazane layer.

Meanwhile, although not shown in the diagram, in an implantation apparatus for continuously implanting plasma ions, the base material film 16 is subjected to repetition, conveyance and winding, and plasma ion implantation can be performed sequentially.

(2) Ion Species

There are no particular limitations on the ion species that are introduced into the vacuum chamber described above and implanted into the polysilazane layer, but examples include ions of noble gases such as argon, helium, neon, krypton, and xenon; ions of fluorocarbon, hydrogen, nitrogen, oxygen, carbon dioxide, chlorine, fluorine, sulfur and the like; ions of alkane-based gases such as methane, ethane, propane, butane, pentane, and hexane; ions of alkene-based gases such as ethylene, propylene, butane, and pentene; ions of alkadiene-based gases such as pentadiene and butadiene; ions of alkyne-based gases such as acetylene and methylacetylene; ions of aromatic hydrocarbon-based gases such as benzene, toluene, xylene, indene, naphthalene, and phenanthrene; ions of cycloalkane-based gases such as cyclopropane and cyclohexane; ions of cycloalkene-based gases such as cyclopentene and cyclohexene; ions of conductive metals such as gold, silver, copper, platinum, nickel, palladium, chromium, titanium, molybdenum, niobium, tantalum, tungsten, and aluminum; and ions of silane ($SiH_4$) and organosilicon compounds.

Among these, from the viewpoint that ions can be implanted more conveniently, and a gas barrier layer having excellent gas barrier properties is obtained, the ion species is preferably at least one ion selected from the group consisting of hydrogen, nitrogen, oxygen, argon, helium, neon, xenon, and krypton.

Particularly, as illustrated in FIGS. 9(a) to 9(f), when the ion species are argon (Ar), krypton (Kr), helium (He), nitrogen (N), neon (Ne), and oxygen (O), it has been found that the fluctuations in the respective numbers of ions calculated by the Monte Carlo simulation (a numerical value analysis carried out using random numbers) for the thickness (nm) in the depth direction, are small, and ion implantation can be performed at a predetermined depth position. Thus, those ions are suitable as the ion species to be implanted.

Meanwhile, the ion species to be implanted into the polysilazane layer, that is, the gas for ion implantation, also has a function as a plasma-producing gas.

(3) Plasma Ion Implantation Pressure

Furthermore, it is preferable to adjust the pressure of the vacuum chamber at the time of implanting ions, that is, the plasma ion implantation pressure, to a value within the range of 0.01 Pa to 1 Pa.

The reason for this is that when the pressure in implanting such plasma ions falls in this range, ions can be uniformly implanted conveniently and efficiently, and a gas barrier layer having both excellent bending resistance and gas barrier properties can be formed efficiently.

Therefore, it is more preferable to adjust the plasma ion implantation pressure to a value within the range of 0.02 Pa to 0.8 Pa, and even more preferably to a value within the range of 0.03 Pa to 0.6 Pa.

(4) Applied Voltage for Plasma Ion Implantation

Furthermore, it is preferable to adjust the applied voltage at the time of implanting ions (high voltage pulse/negative voltage) to a value within the range of −1 kV to −50 kV.

The reason for this is that when ion implantation is carried out at an applied voltage having a value of larger than −1 kV, the amount of ions implanted (dose amount) may be insufficient, and desired gas barrier properties may not be obtained.

On the other hand, when ion implantation is carried out at an applied voltage having a value of smaller than −50 kV, the film is charged at the time of ion implantation, defects such as coloration of the film may occur, and desired gas barrier properties may not be obtained.

Therefore, it is more preferable to adjust the applied voltage at the time of implanting ions to a value within the range of −1 kV to −15 kV, and even more preferably to a value within the range of −5 kV to −8 kV.

4. Use of Gas Barrier Film

Furthermore, the gas barrier film of the present invention may have other layers on the front surface or the back surface of the gas barrier film by providing various layer forming processes.

For example, when a primer layer formed from, for example, a silane coupling agent, a urethane-based primer, an epoxy-based primer, or a polyester-based primer is formed in advance on at least one surface of the base material, adhesiveness between the base material and the gas barrier film can be markedly enhanced.

Furthermore, for the purpose of enhancing durability or enhancing mechanical characteristics, flattening properties and the like, it is also preferable to form an inorganic thin film layer at the interface between the base material and the gas barrier layer, or on the surface of the gas barrier layer or the base material.

Furthermore, for the purpose of enhancing durability or enhancing flexibility or the like, it is also preferable to form an impact absorption layer at the interface between the base material and the gas barrier layer, or on the surface of the gas barrier layer or the base material.

Furthermore, in order to impart antistatic properties or electrical conductivity, it is also preferable to form a conductive layer at the interface between the base material and the gas barrier layer, or on the surface of the gas barrier layer or the base material.

Moreover, for the purpose of enhancing decorativeness or informativeness of an electrical appliance, a gas barrier vessel or the like, which includes the gas barrier film, it is also preferable to form a decorative layer or a print layer (including a metal deposition layer) entirely or partially, at the interface between the base material and the gas barrier layer, or on the surface of the gas barrier layer or the base material.

EXAMPLES

Hereinafter, the present invention will be described in more detail by way of Examples.

Example 1

1. Production of Gas Barrier Film (1) Step 1: Polysilazane Layer Forming Step

A perhydropolysilazane-containing liquid (solvent: xylene, concentration: 10% by weight) was applied on a polyester film (manufactured by Toyobo Co., Ltd., A-4100) having a thickness of 50 μm as a base material, using a spin coater (manufactured by Mikasa Corp., MS-A200, speed of rotation: 3000 rpm, rotation time: 30 seconds), and the liquid was heated and dried under the conditions of 120° C. and 2 minutes. Thus, a polysilazane layer having a thickness of 150 nm was formed.

(2) Step 2: Seasoning Step

Next, the polysilazane layer was left to stand for 48 hours in an environment at 23° C. and 50% RH, and thereby the refractive index of the polysilazane layer was adjusted to 1.5505.

(3) Step 3: Ion Implantation Step

Next, the polysilazane layer thus obtained was subjected to plasma ion implantation under the conditions described below, using a plasma ion implantation apparatus (RF power supply: manufactured by JEOL, Ltd., RF56000, high voltage pulse power supply: manufactured by Kurita Seisakusho Co., Ltd., PV-3-HSHV-0835), and thus a gas barrier film (thickness: 150 nm) having plural regions of Example 1 was obtained.

Chamber internal pressure: 0.2 Pa
Feed gas: argon
RF power output: 1000 W
RF frequency: 1000 Hz
RF pulse width: 50 μsec
RF delay: 25 nsec
DC voltage: −8 kV
DC frequency: 1000 Hz
DC pulse width: 5 μsec
DC delay: 50 μsec
Duty ratio: 0.5%
Treatment time: 300 sec 2. Evaluation of Polysilazane Layer Prior to Plasma Ion Implantation The refractive index of the polysilazane layer prior to plasma ion implantation was measured using a spectroscopic ellipsometer (manufactured by J. A. Woollam Japan, Corp.). The results thus obtained are presented in Table 1.

3. Evaluation of Gas Barrier Film

The gas barrier film finally obtained after plasma ion implantation was subjected to the following evaluations.

(1) XPS Analysis

An elemental analysis on the depth direction of the gas barrier layer in the gas barrier film thus obtained was carried out using an XPS analyzer (manufactured by Ulvac-Phi, Inc., QUANTUM2000). The elemental amount charts obtained by the XPS analysis are presented in FIGS. 6(a) and 6(b). Furthermore, from FIG. 6(b), when the amount of oxygen measured by XPS was designated as X mol %, the amount of nitrogen was designated as Y mol %, and the amount of silicon was designated as Z mol %, the ratio (X/Z) in the first region was in the range of 1.0 to 2.5, and the ratio (Y/Z) was in the range of 0 to 0.5.

Furthermore, it was confirmed from such elemental amount charts, whether a first region and a second region, each having a predetermined refractive index, were formed in the gas barrier layer, or not.

Meanwhile, the case in which the predetermined first region and second region were confirmed was rated as ○, and the case in which the predetermined first region and second region were not confirmed was rated as x.

Furthermore, in regard to the first region, when the amount of oxygen measured by XPS was designated as X mol %, the amount of nitrogen was designated as Y mol %, and the amount of silicon was designated as Z mol %, the case in which it was confirmed that the change curve of the amount of oxygen with respect to the amount of silicon (X/Z) had a minimum point was rated as ○, and the case in which it was not confirmed that the change curve had a minimum point was rated as x.

Meanwhile, in FIG. 6 and FIGS. 10 to 13, the "thickness in the depth direction" indicates the position in the direction from the surface side of the gas barrier layer toward the base material side.

(2) Refractive Index

The refractive index of the gas barrier layer in the gas barrier film thus obtained was divided into the first region and the second region, and each of them was measured using a spectroscopic ellipsometer (manufactured by J.A. Woollam Japan, Corp.). The results thus obtained are presented in Table 1.

(3) Film Density

The film density of the gas barrier layer in the gas barrier film thus obtained was divided into the first region and the second region, and each of them was measured using an X-ray diffraction apparatus (manufactured by Rigaku Corp., fully automated horizontal type multi-purpose X-ray diffraction apparatus, SMART LAB). The results thus obtained are presented in Table 1.

(4) Water Vapor Transmission Rate (WVTR)

The water vapor transmission rate of the gas barrier film thus obtained under the conditions of RH90% and 40° C. was measured using a water vapor transmission rate analyzer (manufactured by Mocon, Inc., AQUATRAN). The results thus obtained are presented in Table 1.

(5) Total Light Transmittance

The total light transmittance (Tt) of the gas barrier film thus obtained was measured using a turbidimeter (manufactured by Nippon Denshoku Industries Co., Ltd., HAZE METER NDH5000) according to JIS K 7631-1. The results thus obtained are presented in Table 1.

(6) Yellowness Index (YI) and b*

The yellowness index (YI) and b* (chromaticness index on the b* axis in the CIE1976 L*a*b* color system) of the gas barrier film thus obtained were respectively measured using a spectral colorimeter (manufactured by Nippon Denshoku Industries Co., Ltd., SPECTRO COLOR METER SQ2000) according to JIS K 7105. The results thus obtained are presented in Table 1.

Meanwhile, more specifically, YI and b* are respectively values defined by the following formulas:

$$YI=100(1.28X-1.067Z)/Y$$

wherein X and Y are values of the tristimulus values in the XYZ coordinate system of the gas barrier film as measured with a colorimeter.

$$b^*=200[(Y/Yn)^{1/3}-(Z/Zn)^{1/3}]$$

wherein Y and Z are values of the tristimulus values in the XYZ coordinate system of the gas barrier film as measured with a colorimeter; and Yn and Zn are values of the tristimulus values at a perfect reflecting diffuser.

Example 2

In Example 2, a gas barrier film was produced in the same manner as in Example 1, except that the DC voltage at the time of plasma ion implantation in Step (3) was changed to −7 kV, and evaluations were carried out. The results thus obtained are presented in Table 1, and the elemental amount charts obtained by an XPS analysis are presented in FIGS. 10(a) and 10(b). Furthermore, from FIG. 10(b), when the amount of oxygen measured by XPS was designated as X mol %, the amount of nitrogen was designated as Y mol %, and the amount of silicon was designated as Z mol %, the ratio (X/Z) in the first region was in the range of 1.0 to 2.5, and the ratio (Y/Z) was in the range of 0 to 0.5.

Example 3

In Example 3, a gas barrier film was produced in the same manner as in Example 1, except that the DC voltage at the time of plasma ion implantation in Step (3) was changed to −6 kV, and evaluations were carried out. The results thus obtained are presented in Table 1, and the elemental amount charts obtained by an XPS analysis are presented in FIGS. 11(a) and 11(b). Furthermore, from FIG. 11(b), when the amount of oxygen measured by XPS was designated as X mol %, the amount of nitrogen was designated as Y mol %, and the amount of silicon was designated as Z mol %, the ratio (X/Z) in the first region was in the range of 1.0 to 2.5, and the ratio (Y/Z) was in the range of 0 to 0.5.

Example 4

In Example 4, a gas barrier film was produced in the same manner as in Example 1, except that the DC voltage at the time of plasma ion implantation in Step (3) was changed to −5 kV, and evaluations were carried out. The results thus obtained are presented in Table 1, and the elemental amount charts obtained by an XPS analysis are presented in FIGS. 12(a) and 12(b). Furthermore, from FIG. 12(b), when the amount of oxygen measured by XPS was designated as X mol %, the amount of nitrogen was designated as Y mol %, and the amount of silicon was designated as Z mol %, the ratio (X/Z) in the first region was in the range of 1.0 to 2.5, and the ratio (Y/Z) was in the range of 0 to 0.5.

Example 5

In Example 5, a gas barrier film was produced in the same manner as in Example 1, except that the polysilazane layer was left to stand for 10 days in an environment at 23° C. and 50% RH to obtain a polysilazane layer having a refractive index of 1.5045 in Step (2) so that this layer was used, and the DC voltage at the time of plasma ion implantation in Step (3) was changed to −10 kV, and evaluations were carried out. The results thus obtained are presented in Table 1, and the elemental amount charts obtained by an XPS analysis are presented in FIGS. 13(a) and 13(b). Furthermore, from FIG. 13(b), when the amount of oxygen measured by XPS was designated as X mol %, the amount of nitrogen was designated as Y mol %, and the amount of silicon was designated as Z mol %, the ratio (X/Z) in the first region was in the range of 1.0 to 2.5, and the ratio (Y/Z) was in the range of 0 to 0.5.

Comparative Example 1

Figure 14A:
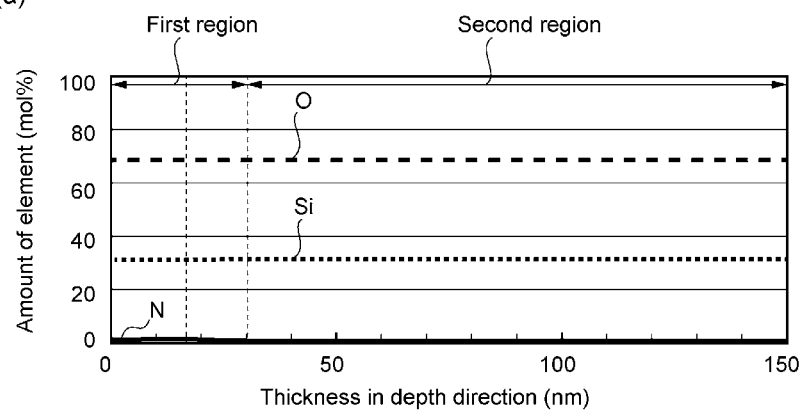
FIG. 14(a) is a diagram provided to illustrate the relationship between the thickness in the depth direction and the amounts of elements (amount of nitrogen, amount of silicon, and amount of oxygen) measured by an XPS analysis, for the gas barrier layer in the gas barrier film of Comparative Example 1.
Figure 14B:
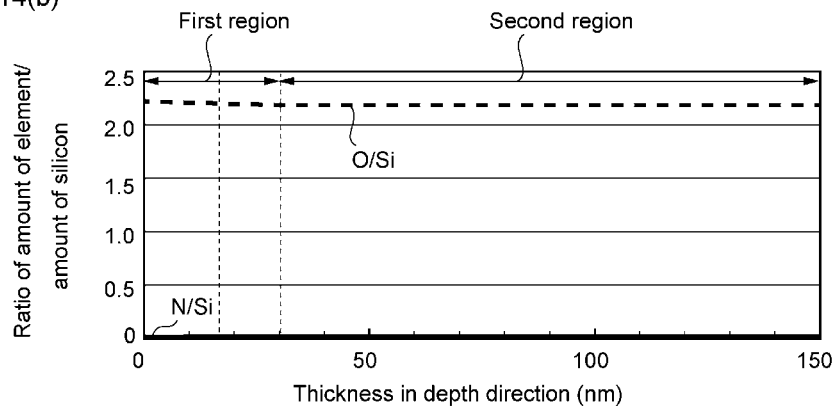
FIG. 14(b) is a diagram provided to illustrate the relationship of the thickness in the depth direction to the ratio of amount of oxygen/amount of silicon (X/Z) and to the ratio of amount of nitrogen/amount of silicon (Y/Z).

In Comparative Example 1, a gas barrier film was produced in the same manner as in Example 1, except that the perhydropolysilazane-containing liquid after a heating treatment was left to stand for 20 days in an environment at 23° C. and 50% RH to obtain a polysilazane layer having a refractive index of 1.4601 in Step (1) so that this was used, and the DC voltage at the time of plasma ion implantation in Step (2) was changed to −10 kV, and evaluations were carried out. The results thus obtained are presented in Table 1, and the elemental amount charts obtained by an XPS analysis are presented in FIGS. 14(a) and 14(b). Furthermore, from FIG. 14(b), when the amount of oxygen measured by XPS was designated as X mol %, the amount of nitrogen was designated as Y mol %, and the amount of silicon was designated as Z mol %, the ratio (X/Z) in the first region was in the range of 1.0 to 2.5, and the ratio (Y/Z) was in the range of 0 to 0.5.

TABLE 1

|  | Example 1 | Example 2 | Example 3 | Example 4 | Example 5 | Comparative Example 1 |
|---|---|---|---|---|---|---|
| Refractive index of polysilazane layer after Step (2) | 1.5505 | 1.5505 | 1.5505 | 1.5505 | 1.5045 | 1.4601 |
| Plasma ion implantation voltage (V) | −8 | −7 | −6 | −5 | −10 | −10 |
| Presence or absence of first region and second region of gas barrier layer | ○ | ○ | ○ | ○ | ○ | X |
| Presence or absence of minimum point on change curve of X/Z | ○ | ○ | ○ | ○ | ○ | X |
| Refractive index |  |  |  |  |  |  |
| First region | 1.6560 | 1.6068 | 1.5507 | 1.5101 | 1.6014 | 1.4511 |
| Second region | 1.4564 | 1.4560 | 1.4549 | 1.4636 | 1.4543 | 1.4511 |
| Film density (g/cm$^3$) |  |  |  |  |  |  |
| First region | 2.85 | 2.72 | 2.69 | 2.66 | 2.71 | 2.01 |
| Second region | 2.28 | 2.13 | 1.95 | 2.02 | 2.08 | 2.01 |
| WVTR (g/(m$^2$ · day)) | 0.0151 | 0.0182 | 0.0210 | 0.0291 | 0.0179 | 5.4100 |
| Tt (%) | 88.03 | 89.07 | 91.15 | 91.16 | 89.21 | 92.50 |
| YI (—) | 3.60 | 2.59 | 1.93 | 1.58 | 2.50 | 0.30 |
| b* (—) | 1.69 | 1.11 | 1.02 | 0.63 | 1.21 | 0.11 |

INDUSTRIAL APPLICABILITY

As described above in detail, according to the present invention, in a gas barrier film having a gas barrier layer on a base material, since the gas barrier layer has a first region and a second region, which have different refractive indices, the gas barrier film has excellent gas barrier properties, and superior transparency is obtained.

Furthermore, according to the method for producing a gas barrier film of the present invention, a first region and a second region having different refractive indices can be formed easily and accurately, substantially in a single process, so that the production method can contribute to stable production and quantitative production.

Therefore, the gas barrier film of the present invention is expected to be used in various applications where predetermined gas barrier properties, transparency and the like are desired, such as electrical appliances, electronic components, image display devices (organic electroluminescent elements, liquid crystal display devices, and the like), solar cells, transparent conductive materials, PET bottles, packaging containers, and glass containers.

EXPLANATIONS OF LETTERS OR NUMERALS

10 POLYSILAZANE LAYER
10a COATING LAYER OF POLYSILAZANE COMPOUND
10' GAS BARRIER LAYER
10a' FIRST REGION
10b' SECOND REGION
12 BASE MATERIAL
50 GAS BARRIER FILM
100 PLASMA ION IMPLANTATION APPARATUS
16 BASE MATERIAL 12 HAVING POLYSILAZANE LAYER 10 FORMED THEREON (BASE MATERIAL FILM)
102 CONDUCTOR
103 GAS INLET PORT
107 OSCILLOSCOPE
108 DIRECT CURRENT APPLICATION APPARATUS (PULSE POWER SUPPLY)
110 HIGH VOLTAGE INPUT TERMINAL
111 VACUUM CHAMBER

The invention claimed is:

1. A method for producing a gas barrier film having a gas barrier layer on a base material, the method comprising the following steps (1) to (3):
   (1) a polysilazane layer forming step of forming a polysilazane layer on the base material;
   (2) a seasoning step of performing seasoning of the polysilazane layer at a temperature of 15° C. to 35° C. for 24 hours to 240 hours to adjust the refractive index of the polysilazane layer to a value within the range of 1.50 to 1.58; and then
   (3) an ion implantation step of implanting ions into the polysilazane layer, and forming a gas barrier layer including, from the surface side toward the base material side, a first region having a refractive index of a value within the range of 1.50 to 1.68, and a second region having a refractive index of a value within the range of 1.40 to below 1.50,
   wherein the yellowness index (YI) of the gas barrier layer is adjusted to a value of 1.0 to 3.6,
   the total light transmission (Tt) of the gas barrier layer is adjusted to a value of 88% or more, and
   the water vapor transmission rate (WVTR) of the gas barrier layer is adjusted to a value of 0.05 g (m$^2$·day) or less.

2. The method for producing a gas barrier film according to claim 1, wherein the film density in the first region is adjusted to a value within the range of 2.3 g/cm$^3$ to 3.0 g/cm$^3$.

3. The method for producing a gas barrier film according to claim 1, wherein the thickness of the first region is adjusted to a value within the range of 10 nm to 30 nm.

4. The method for producing a gas barrier film according to claim 1, wherein in the first region, when the amount of oxygen measured by XPS is designated as X mol %, the amount of nitrogen is designated as Y mol %, and the amount of silicon is designated as Z mol %, the ratio X/Z is adjusted to a value within the range of 1.0 to 2.5, and the ratio Y/Z is adjusted to a value within the range of 0 to 0.5.

5. The method for producing a gas barrier film according to claim 1, wherein in the first region, the amount of oxygen measured by XPS is designated as X mol %, the amount of silicon is designated as Z mol %, and a curve of the ratio X/Z from the surface side toward the base material has a minimum point.

6. The method for producing a gas barrier film according to claim 1, wherein in the first region, the amount of silicon measured by XPS is adjusted to a value within the range of 25 to 45 mol %, the amount of oxygen is adjusted to a value within the range of 54 to 74 mol %, and the amount of nitrogen is adjusted to a value within the range of 0.1 to 15 mol %, relative to a total amount of the amount of silicon, the amount of oxygen, and the amount of nitrogen.

* * * * *